United States Patent
Zhao et al.

(10) Patent No.: US 9,653,583 B1
(45) Date of Patent: May 16, 2017

(54) METHODS OF FORMING DIFFUSION BREAKS ON INTEGRATED CIRCUIT PRODUCTS COMPRISED OF FINFET DEVICES

(71) Applicant: GLOBALFOUNDRIES Inc., Grand Cayman (KY)

(72) Inventors: Wei Zhao, Fort Lee, NJ (US); Haiting Wang, Clifton Park, NY (US); Hongliang Shen, Ballston Lake, NY (US); Zhenyu Hu, Clifton Park, NY (US); Min-Hwa Chi, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/226,165

(22) Filed: Aug. 2, 2016

(51) Int. Cl.
*H01L 21/8238* (2006.01)
*H01L 21/66* (2006.01)
*H01L 29/66* (2006.01)
*H01L 21/02* (2006.01)
*H01L 21/762* (2006.01)
*H01L 21/3105* (2006.01)

(52) U.S. Cl.
CPC .. *H01L 29/66795* (2013.01); *H01L 21/02164* (2013.01); *H01L 21/31053* (2013.01); *H01L 21/76224* (2013.01); *H01L 21/823821* (2013.01); *H01L 21/823857* (2013.01); *H01L 21/823878* (2013.01); *H01L 29/66545* (2013.01)

(58) Field of Classification Search
CPC ......... H01L 29/66795; H01L 21/02164; H01L 21/76224; H01L 29/66545; H01L 21/31053; H01L 21/823878; H01L 21/823857; H01L 21/823821
See application file for complete search history.

(56) References Cited

U.S. PATENT DOCUMENTS

| | | | |
|---|---|---|---|
| 8,846,491 B1 | 9/2014 | Pham et al. | |
| 8,878,309 B1 * | 11/2014 | Hong | H01L 27/0886 257/330 |
| 8,916,460 B1 | 12/2014 | Kwon et al. | |
| 9,299,700 B2 * | 3/2016 | Park | H01L 29/0653 |
| 9,362,181 B1 * | 6/2016 | Xie | H01L 21/823878 |
| 9,362,386 B2 * | 6/2016 | Huang | H01L 29/66977 |
| 9,412,616 B1 * | 8/2016 | Xie | H01L 21/76224 |
| 2014/0117454 A1 | 5/2014 | Liu et al. | |

(Continued)

*Primary Examiner* — Savitr Mulpuri
(74) *Attorney, Agent, or Firm* — Amerson Law Firm, PLLC

(57) ABSTRACT

One illustrative method disclosed herein includes, among other things, forming a first gate structure above a fin, forming epi semiconductor material on the fin, performing at least one first etching process through a patterned sacrificial layer of material to remove at least a gate cap layer and sacrificial gate materials of the first gate structure so as to define a first isolation cavity that exposes the fin while leaving the second gate structure intact, performing at least one second etching process through the first isolation cavity to remove at least a portion of a vertical height of the fin and thereby form a first isolation trench, removing the patterned sacrificial layer of material, and forming a layer of insulating material above the epi semiconductor material and in the first isolation trench and in the first isolation cavity.

25 Claims, 22 Drawing Sheets

(56) References Cited

U.S. PATENT DOCUMENTS

| | | | |
|---|---|---|---|
| 2015/0069532 A1* | 3/2015 | Xie | H01L 29/66545 257/410 |
| 2015/0091100 A1* | 4/2015 | Xie | H01L 21/76224 257/401 |
| 2015/0171216 A1* | 6/2015 | Xie | H01L 21/0217 257/401 |

* cited by examiner

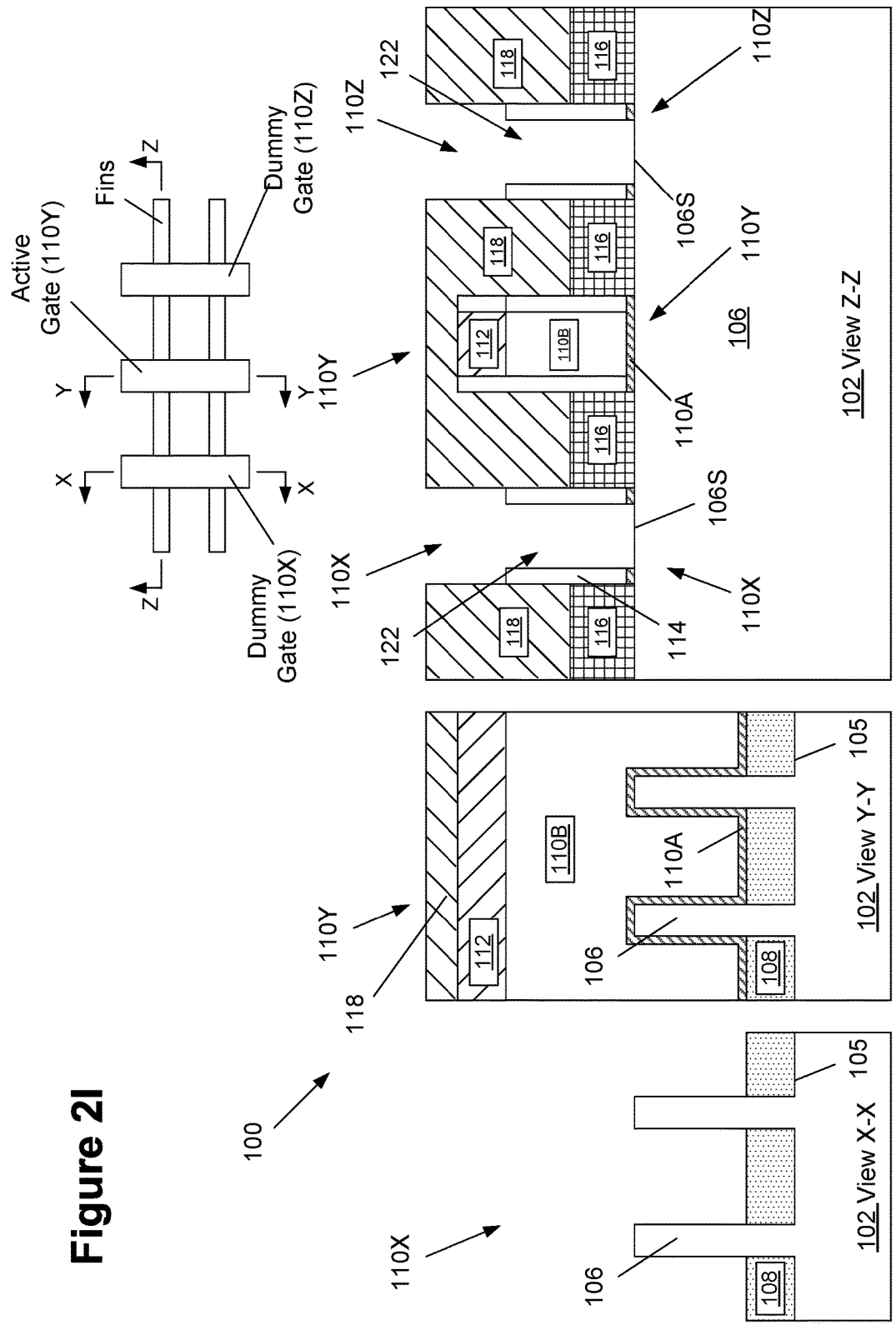

METHODS OF FORMING DIFFUSION BREAKS ON INTEGRATED CIRCUIT PRODUCTS COMPRISED OF FINFET DEVICES

BACKGROUND OF THE INVENTION

1. Field of the Invention

Generally, the present disclosure relates to the manufacture of semiconductor devices, and, more specifically, to various novel methods of forming diffusion breaks on integrated circuit (IC) products comprised of FinFET devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

A conventional FET is a planar device wherein the entire channel region of the device is formed parallel and slightly below the planar upper surface of the semiconducting substrate. In contrast to a planar FET, there are so-called 3D devices, such as an illustrative FinFET device, which is a three-dimensional structure. FIG. 1A is a perspective view of an illustrative prior art FinFET semiconductor device 10 that is formed above a semiconductor substrate 12 wherein the fins 14 of the device 10 are made of the material of the substrate 12, e.g., silicon. The device 10 includes a plurality of fin-formation trenches 13, three illustrative fins 14, a gate 16, a sidewall spacer 18 and a gate cap layer 20. An insulating material 17 provides electrical isolation between the fins 14. The gate 16 is typically comprised of a layer of insulating material (not separately shown), e.g., a layer of high-k insulating material, and one or more conductive material layers that serve as the gate electrode for the device 10. The fins 14 have a three dimensional configuration: a height H, a width W and an axial length L. The axial length L corresponds to the gate length (GL) of the device, i.e., the direction of current travel in the device 10 when it is operational. The gate width (GW) of the device 10 is orthogonal to the gate length direction. The portions of the fins 14 covered by the gate 16 are the channel region of the FinFET device 10. The portions of the fins 14 that are positioned outside of the spacers 18 will become part of the source/drain regions of the device 10. Typically, additional epi semiconductor material (not shown) is formed on the portions of the fins 14 in the source/drain regions. A trench may or may not be formed in the fins 14 prior to the formation of the epi material. The epi material may be formed so as to result in merged or un-merged epi material in the source/drain regions.

Both FET and FinFET semiconductor devices have an isolation structure, e.g., a shallow trench isolation structure, that is formed in the semiconducting substrate around the device so as to electrically isolate the semiconductor device. Traditionally, isolation structures were always the first structure that was formed when manufacturing semiconductor devices. The isolation structures were formed by etching the trenches for the isolation structures and thereafter filling the trenches with the desired insulating material, e.g., silicon dioxide. After the isolation structures were formed, various process operations were performed to manufacture the semiconductor device. In the case of a FinFET device, this involved masking the previously formed isolation structure and etching the trenches in the substrate that defined the fins. As FinFET devices have been scaled to meet ever increasing performance and size requirements, the width of the fins 14 has become very small, e.g., 6-12 nm, and the fin pitch has also been significantly decreased, e.g., the fin pitch may be on the order of about 30-60 nm.

However, as the dimensions of the fins became smaller, problems arose with manufacturing the isolation structures before the fins were formed. As one example, trying to accurately define very small fins in regions that were separated by relatively large isolation regions was difficult due to the non-uniform spacing between various structures on the substrate. One manufacturing technique that is employed in manufacturing FinFET devices is to initially etch the fin-formation trenches 13 in the substrate 12 to define multiple "fins" that extend across the entire substrate 12 (or area of the substrate where FinFET devices will be formed), and thereafter remove portions of the fins where isolation structures will be formed. Using this type of manufacturing approach, better accuracy and repeatability may be achieved in forming the fins 14 to very small dimensions due to the more uniform environment in which the etching process that forms the trenches 13 is performed. After the trenches 13 are formed, some portion of some of the fins 14 must be removed to create room for or define the spaces where isolation regions will ultimately be formed.

FIG. 1B is a simplistic plan view of a plurality of fins that have been initially formed in the substrate 12. Also depicted in dashed lines are a plurality of gates that will eventually be formed across the fins after portions of the fins are cut and removed.

As shown in FIG. 1C, a FinFET device will eventually be formed that has an active gate structure. Also depicted are illustrative "dummy" gate structures (for this particular active FinFET device) that are positioned laterally adjacent the active gate structure. The gate structures are still depicted in dashed lines as they have not yet been formed. Additionally, it should be noted that the "dummy" gate structures are dummy or inactive gate structures as it relates to the active FinFET device, portions of these dummy gates may constitute active gates for other FinFET devices formed in other regions of the substrate. Also depicted are two openings 22 in a patterned masking layer, e.g., a patterned layer of photoresist that has been formed above the fins. The patterned masking layer may sometimes be referred to as a "fin-cut" mask. The openings 22 in the patterned masking layer correspond to portions of the fins that are to be cut and removed so as to make room for isolation structures on opposite sides of the active FinFET device.

FIG. 1D depicts the product after an etching process was performed to remove the portions of the fins exposed by the openings 22 in the patterned masking layer and after the patterned masking layer was removed. As indicated in the dashed line regions 24, portions of the fins have been removed to make room for the isolation structures.

FIG. 1E depicts the product at a later stage of fabrication wherein the gates have been formed across the fins. As depicted in the dashed line regions 26, by performing the fin cutting process before the gates are formed, there is significant risk that the gate passing above the openings 24 (see FIG. 1D) will not cover the exposed ends of the fins that were cut. As an example, it may be extremely difficult to accurately align the openings 22 in the fin cut mask with the precise location where the fins are to be removed and where the gate will subsequently be formed. Additionally, the actual size of the opening 24 in the fins may be larger or smaller than a target size due to etching process variabilities.

As a result of the situation depicted in FIG. 1E, when the additional epi semiconductor material is formed on the exposed portions of the fins not covered by the gates, the epi material formed on fins that were cut may not be as uniform as epi material that is formed on other un-cut portions of the fins. For example, the epi material formed on such devices may have a faceted edge and a smaller volume of epi material as compared to what was anticipated by the design process. Formation of such non-uniform epi material on the source/drain regions of FinFET devices can lead to reduced performance of such devices relative to what is anticipated by the design process which, in turn, can lead to an overall decrease in the performance capabilities of the integrated circuit product.

The present disclosure is directed to methods of forming diffusion breaks on IC products comprised of FinFET devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming diffusion breaks on IC products comprised of FinFET devices. One illustrative method disclosed herein includes, among other things, forming a first gate structure above a fin, forming epi semiconductor material on exposed portions of the fin, forming a patterned sacrificial layer of material above the epi semiconductor material, wherein the patterned sacrificial layer of material covers a second gate structure while exposing at least a gate cap layer of the first gate structure, and performing at least one first etching process through the patterned sacrificial layer of material to remove at least the gate cap layer and sacrificial gate materials of the first gate structure so as to define a first isolation cavity that exposes the fin while leaving the second gate structure intact. In this example, the method further includes performing at least one second etching process through the first isolation cavity to remove at least a portion of a vertical height of the fin and thereby form a first isolation trench, removing the patterned sacrificial layer of material and forming a layer of insulating material above the epi semiconductor material and in the first isolation trench and in the first isolation cavity.

BRIEF DESCRIPTION OF THE DRAWINGS

The disclosure may be understood by reference to the following description taken in conjunction with the accompanying drawings, in which like reference numerals identify like elements, and in which.

Figure 1A:
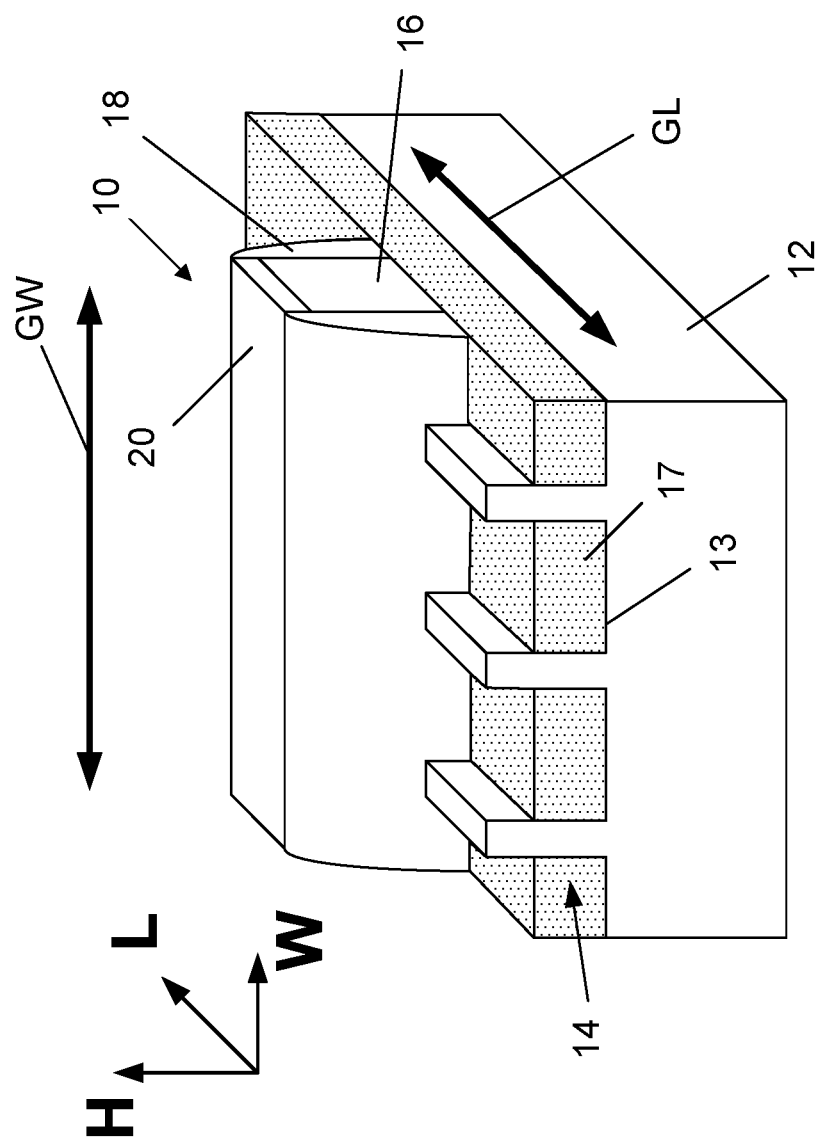
FIGS. 1A-1E depict an illustrative prior art FinFET device.
Figure 1B:
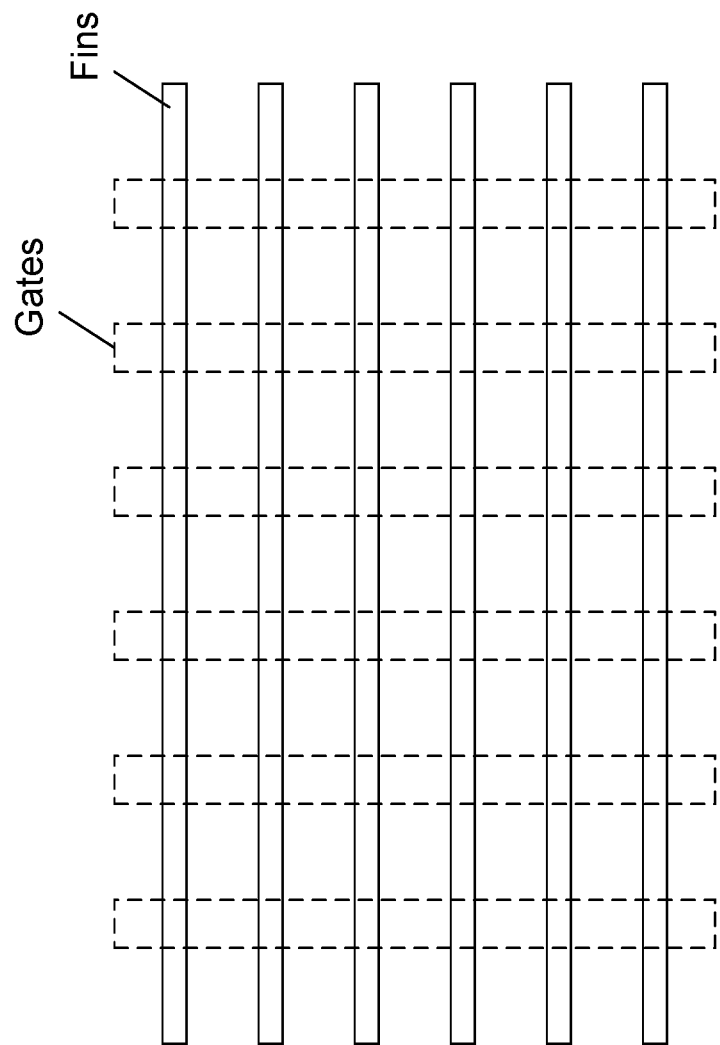
Figure 1C:
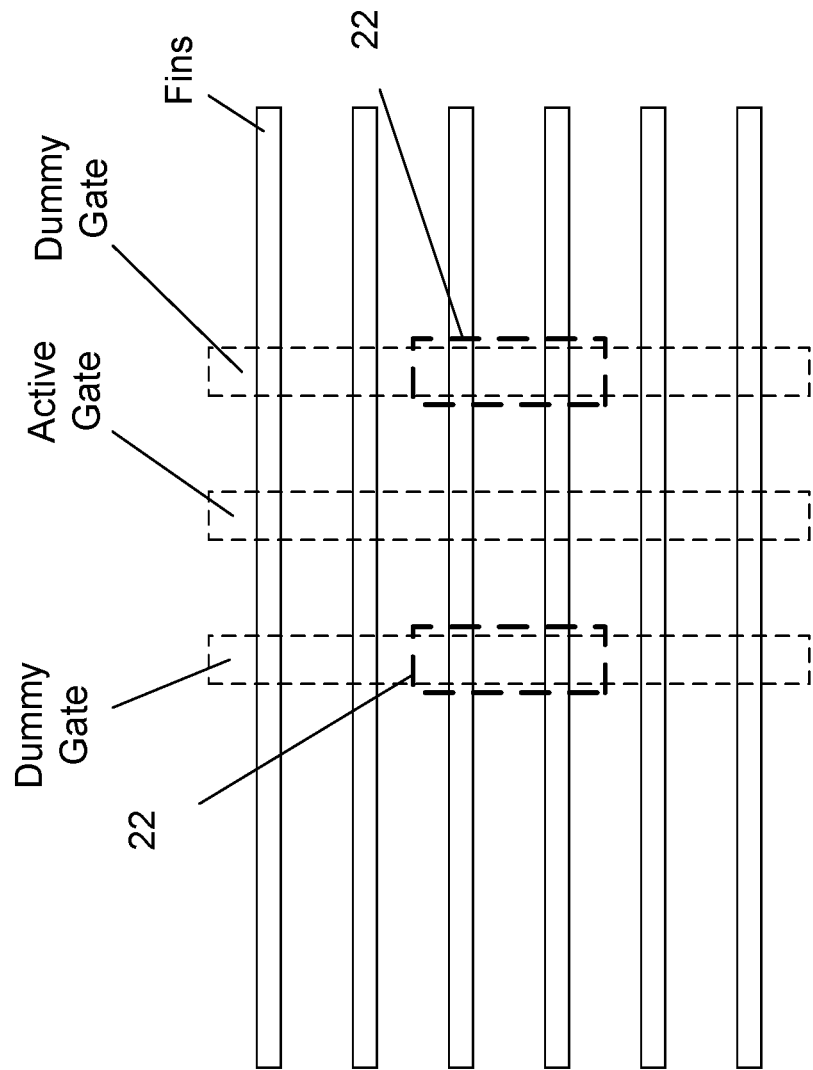
Figure 1D:
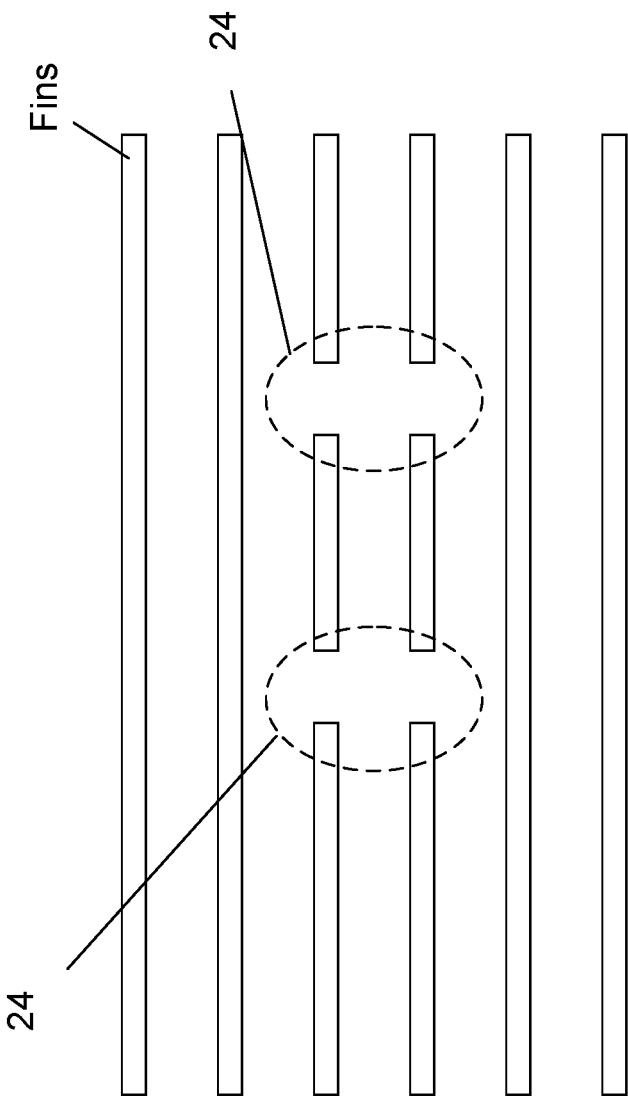
Figure 1E:
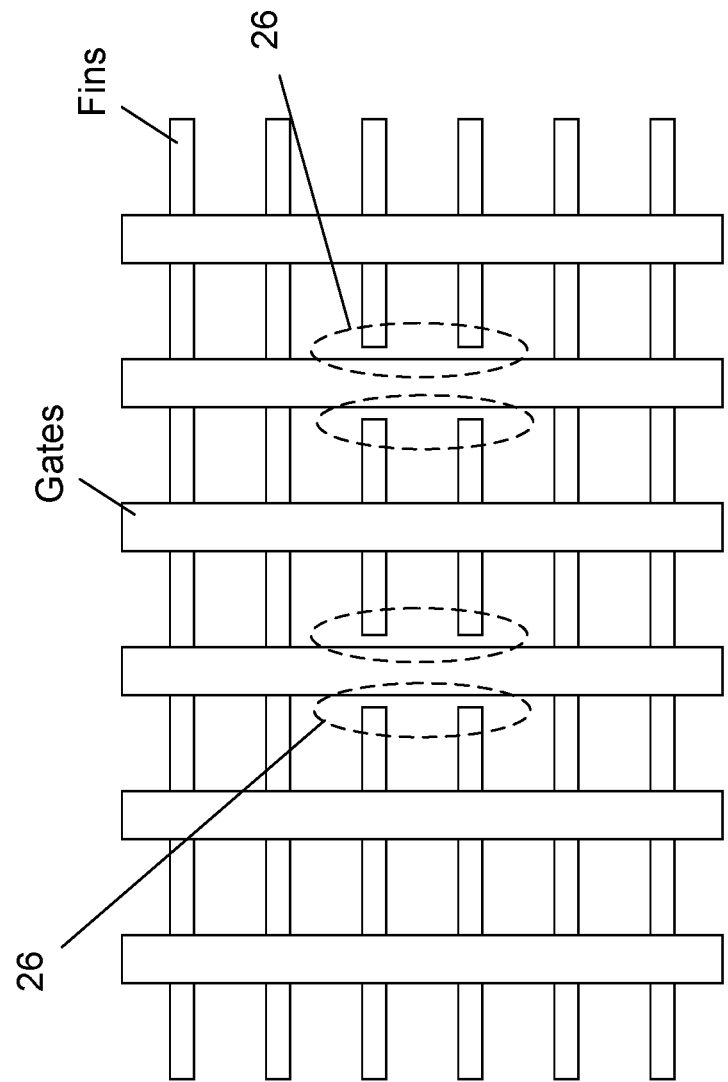

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
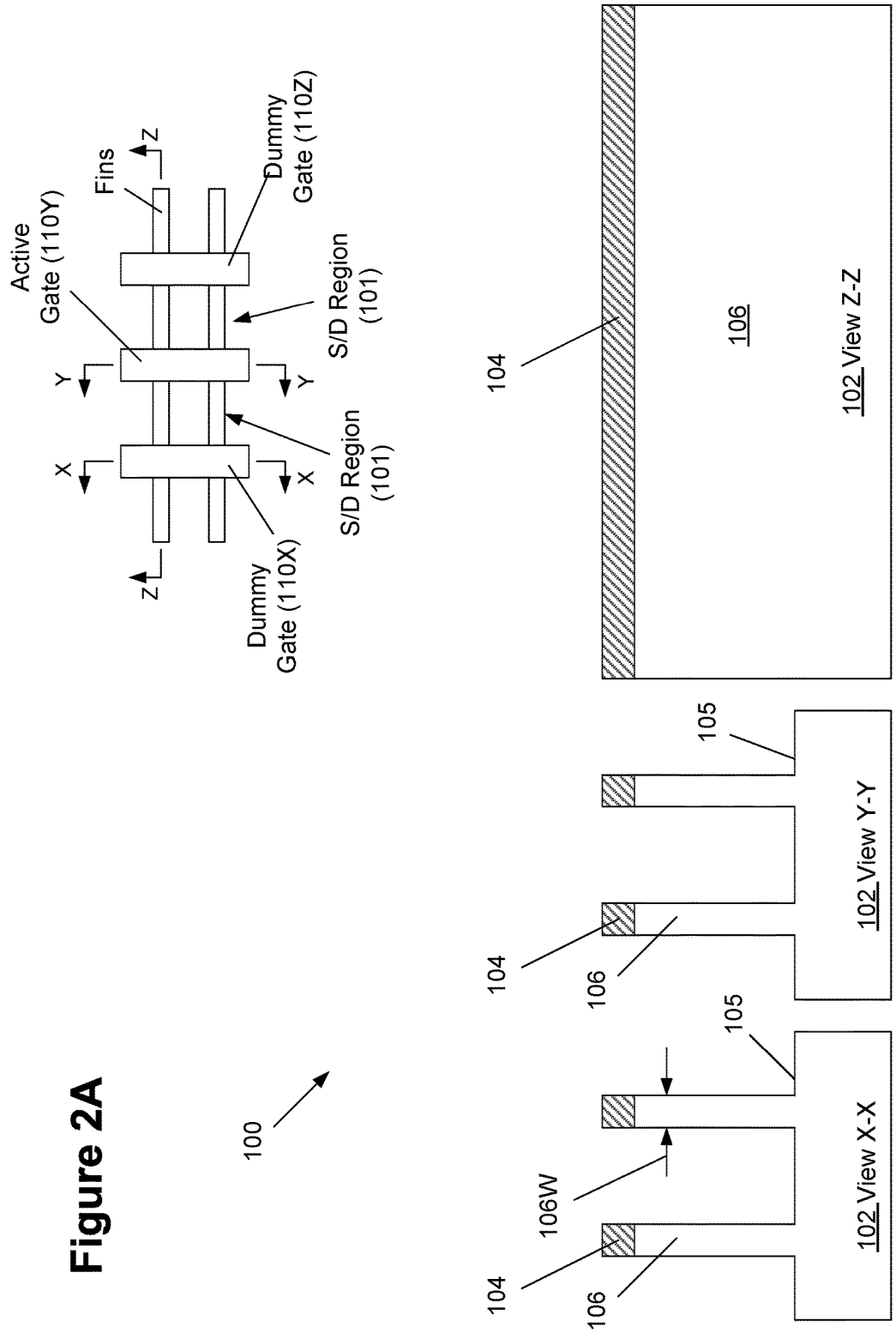
FIGS. 2A-2R depict various illustrative novel methods disclosed herein for forming diffusion breaks on IC products comprised of FinFET devices.
Figure 2B:
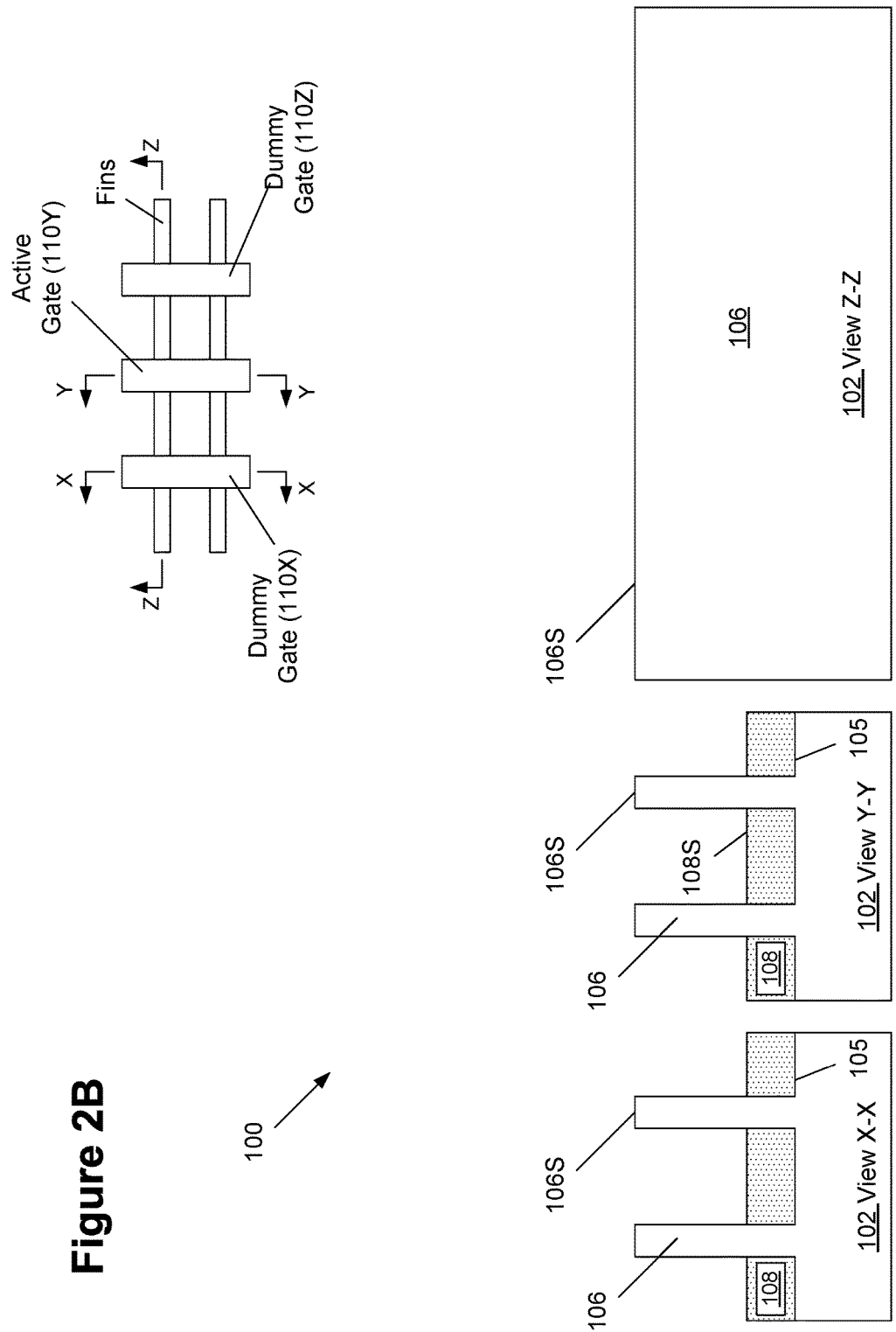
Figure 2C:
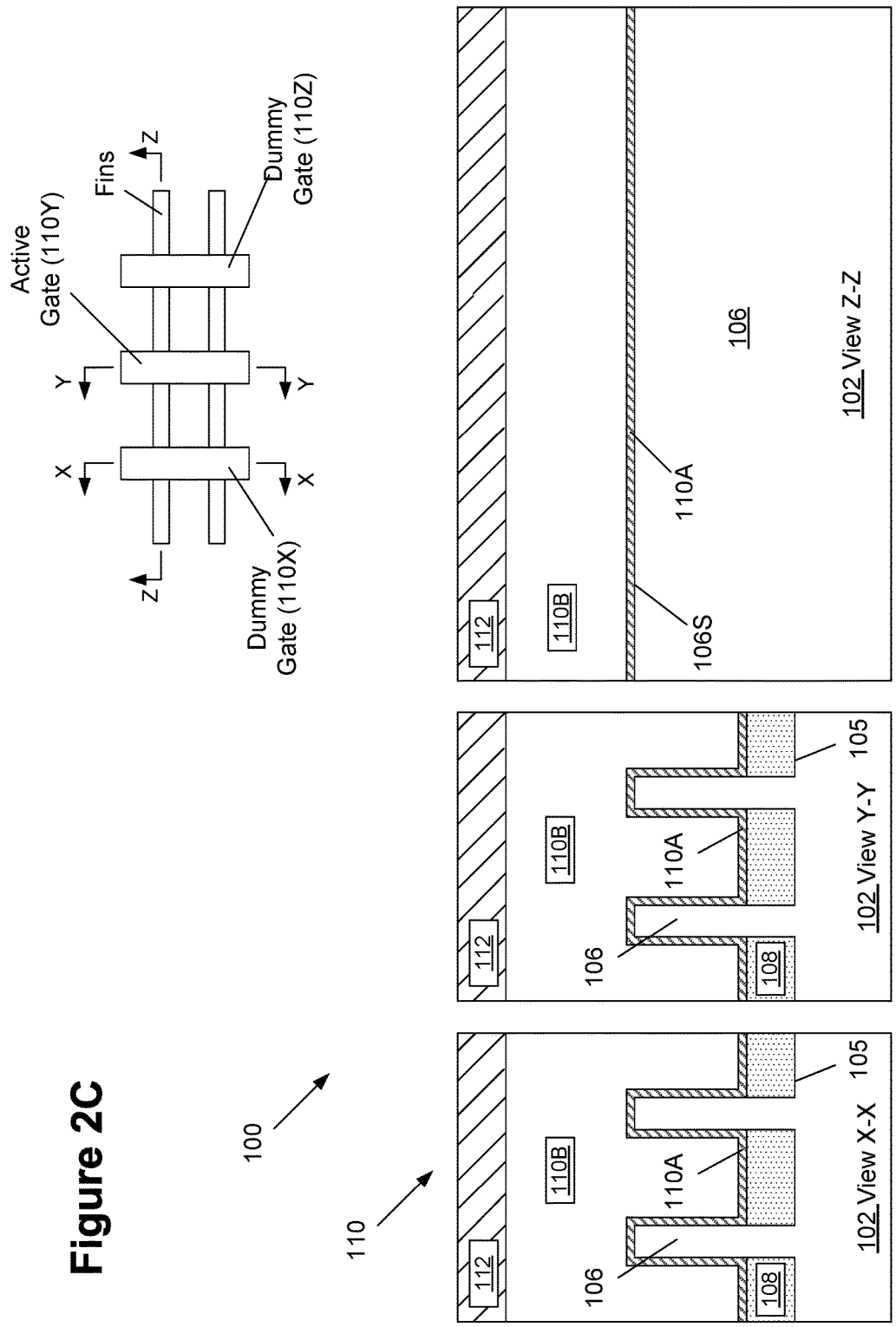
Figure 2D:
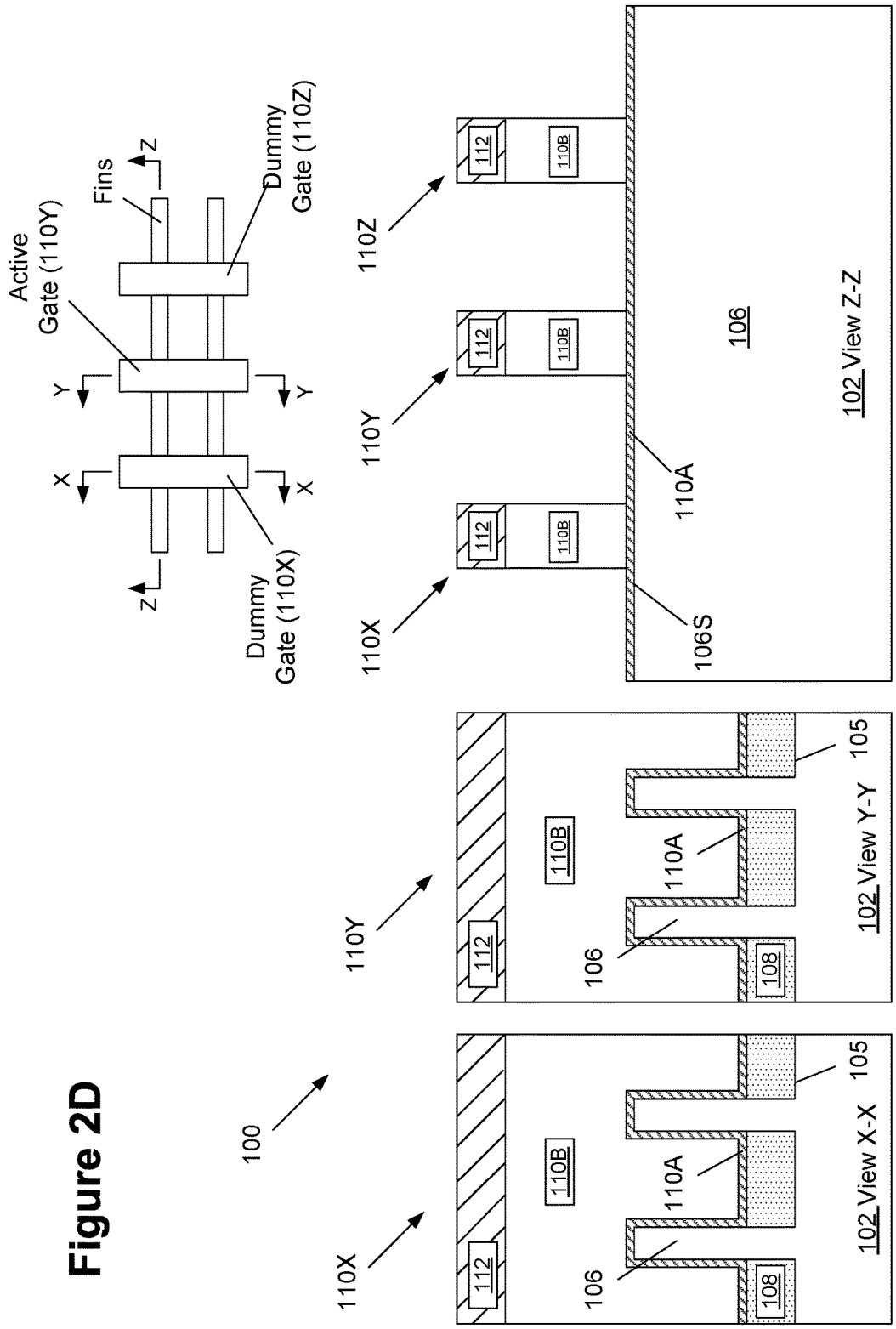
Figure 2E:
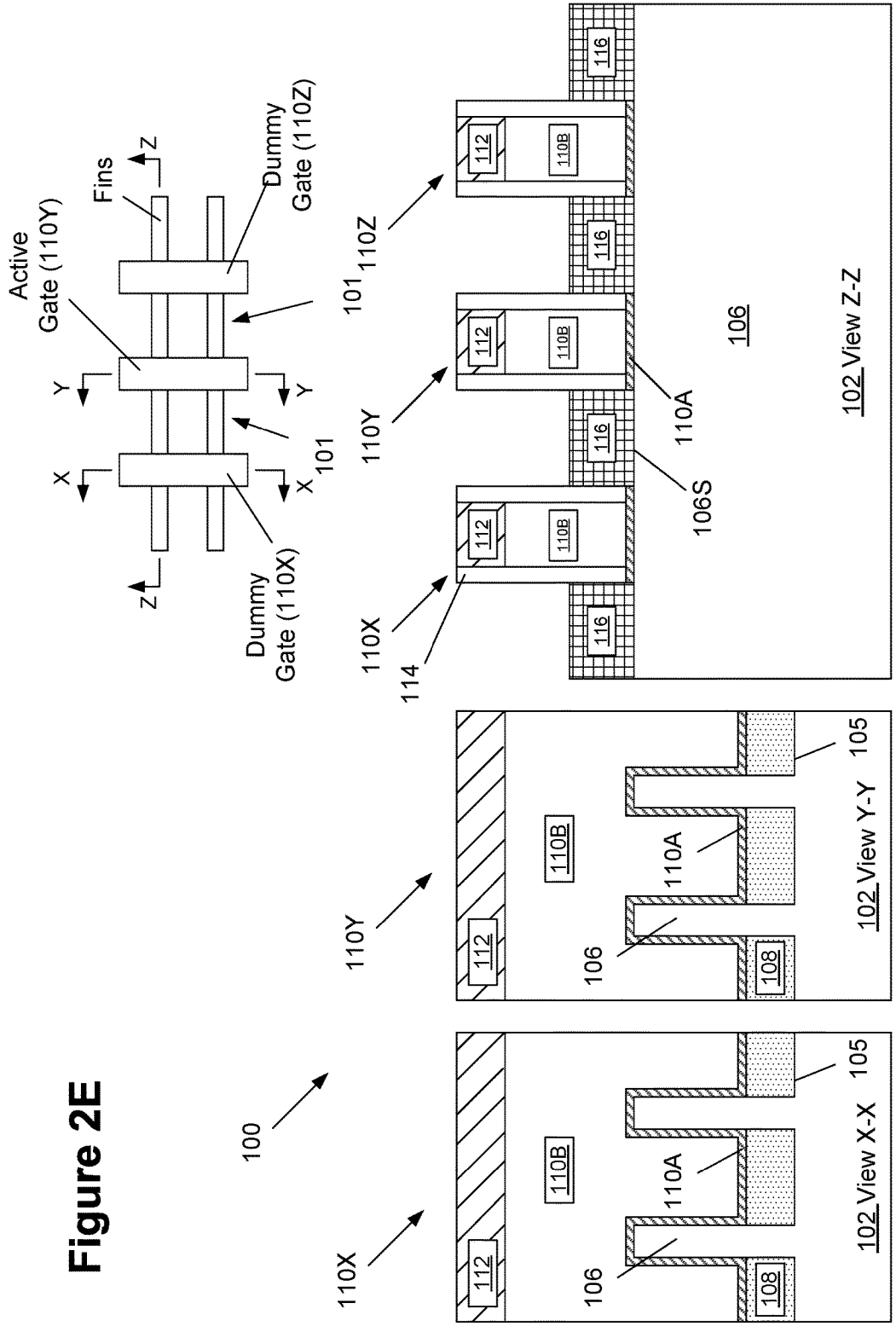
Figure 2F:
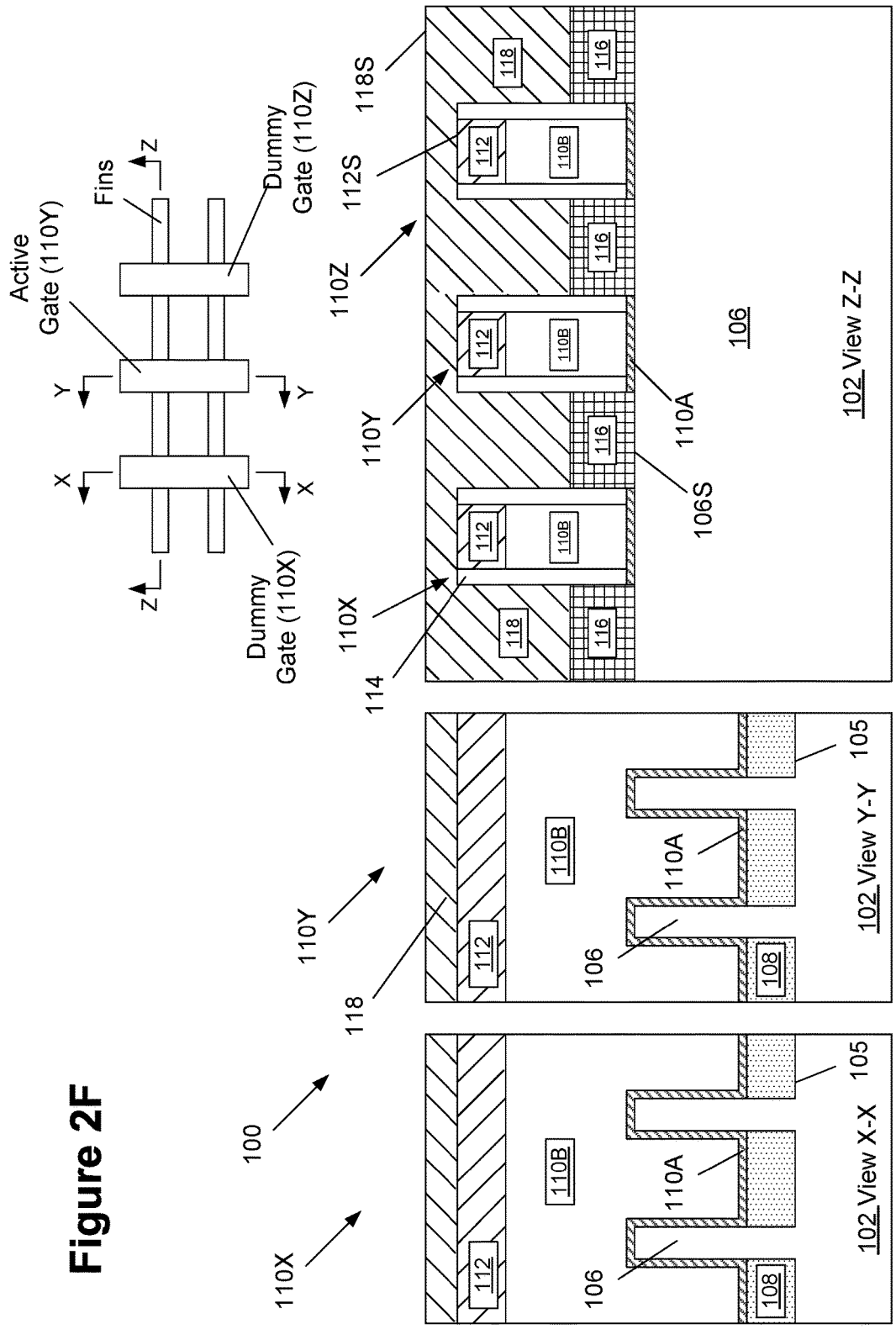
Figure 2G:
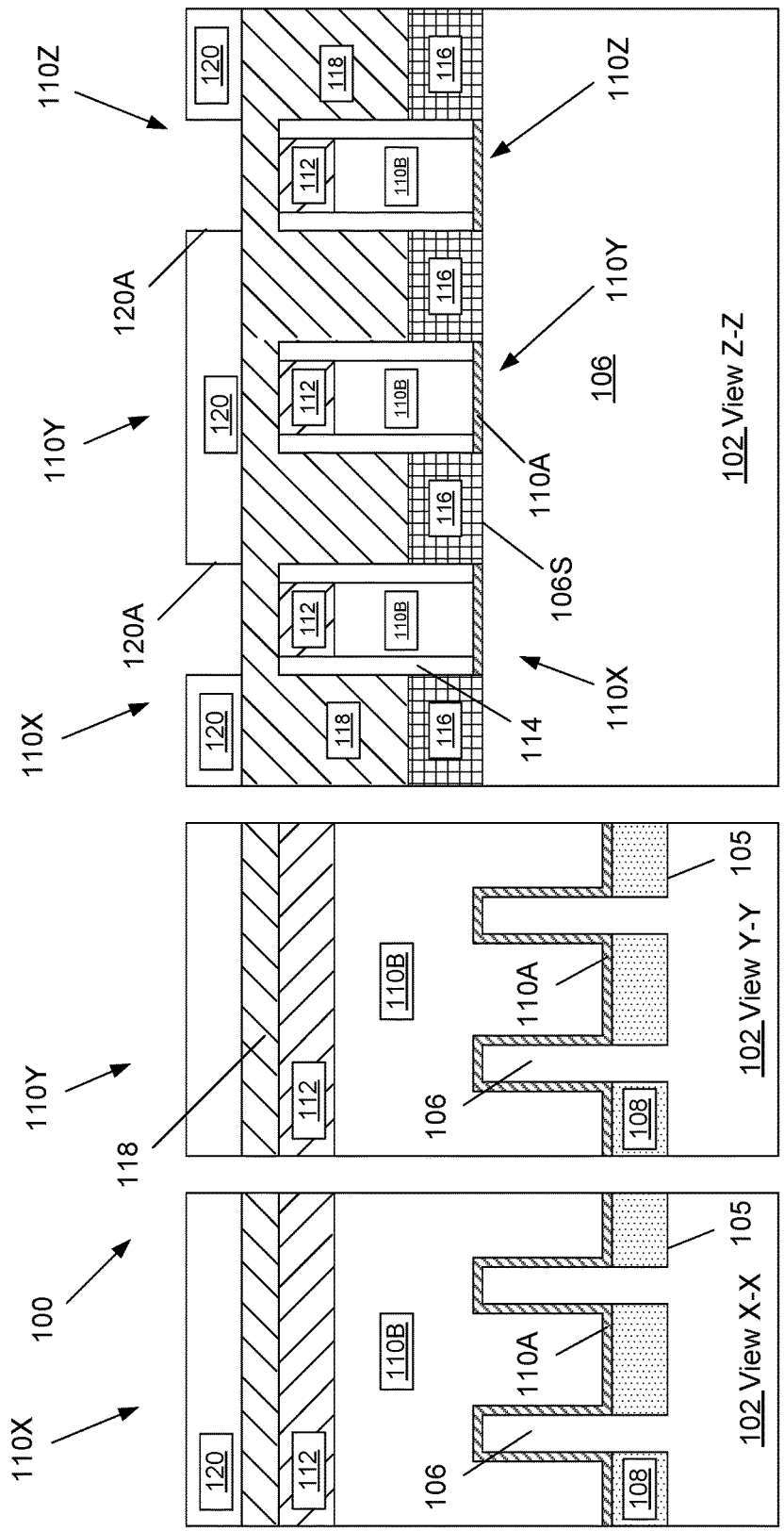
Figure 2H:
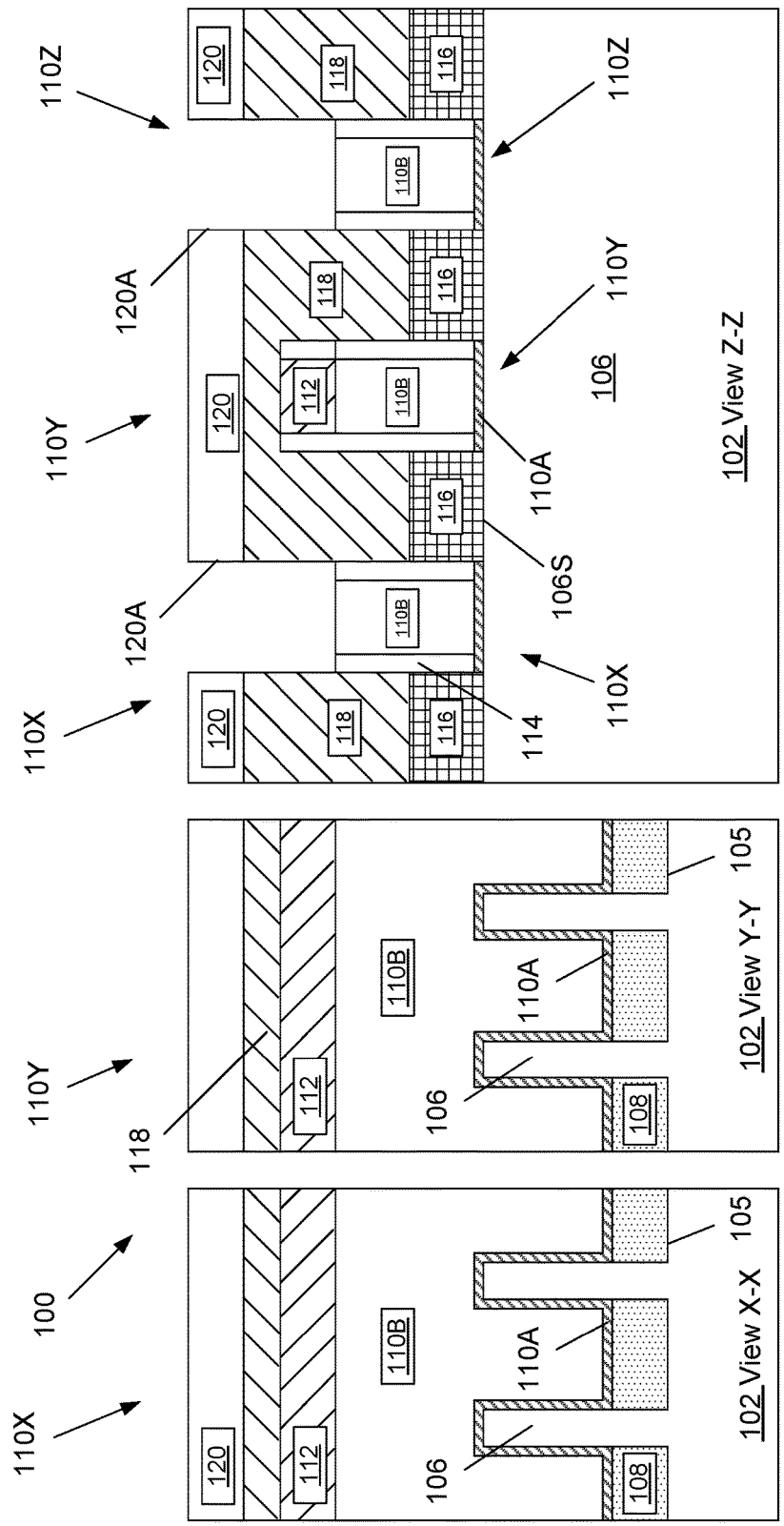
Figure 2J:
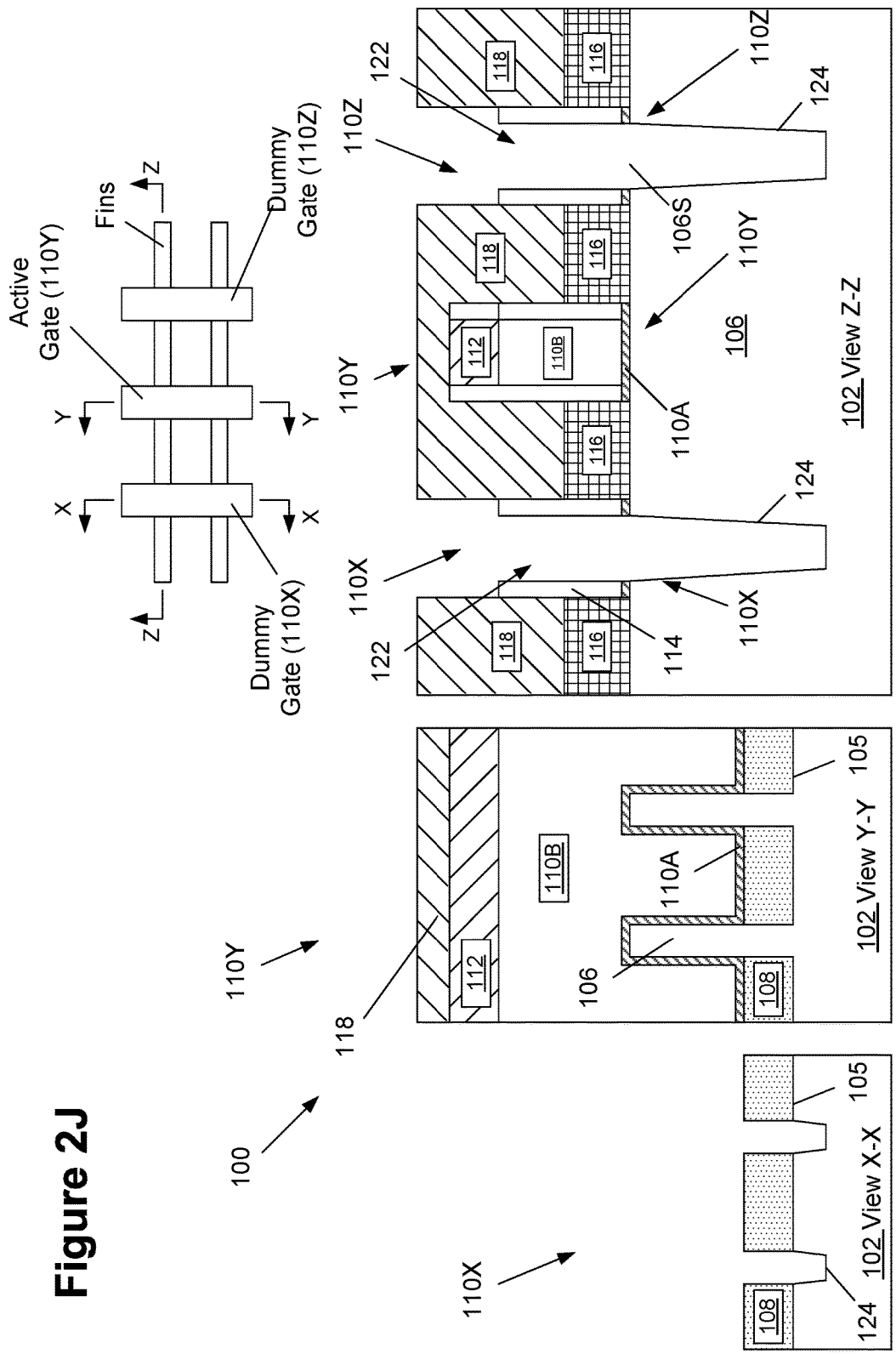
Figure 2K:
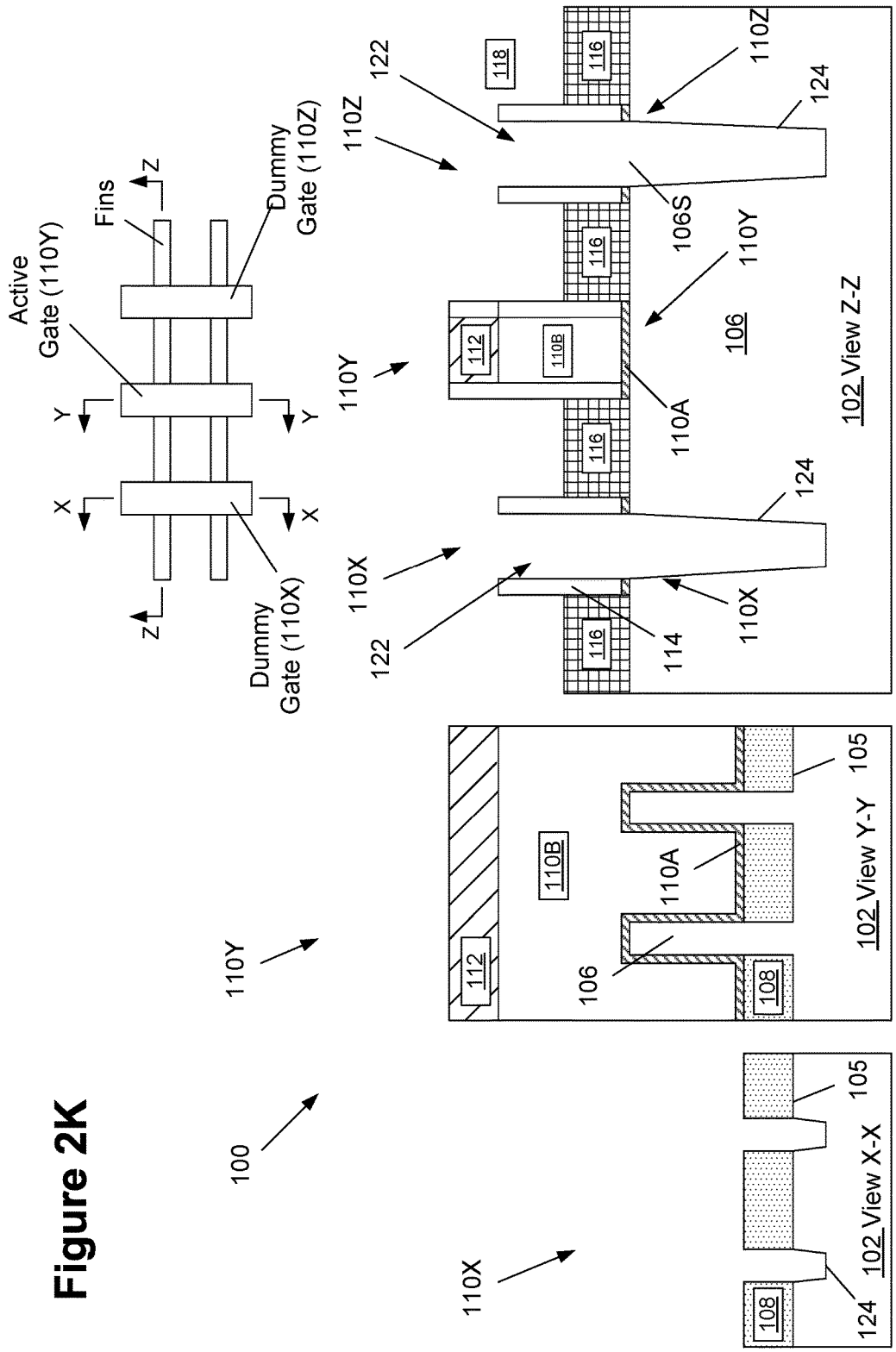
Figure 2L:
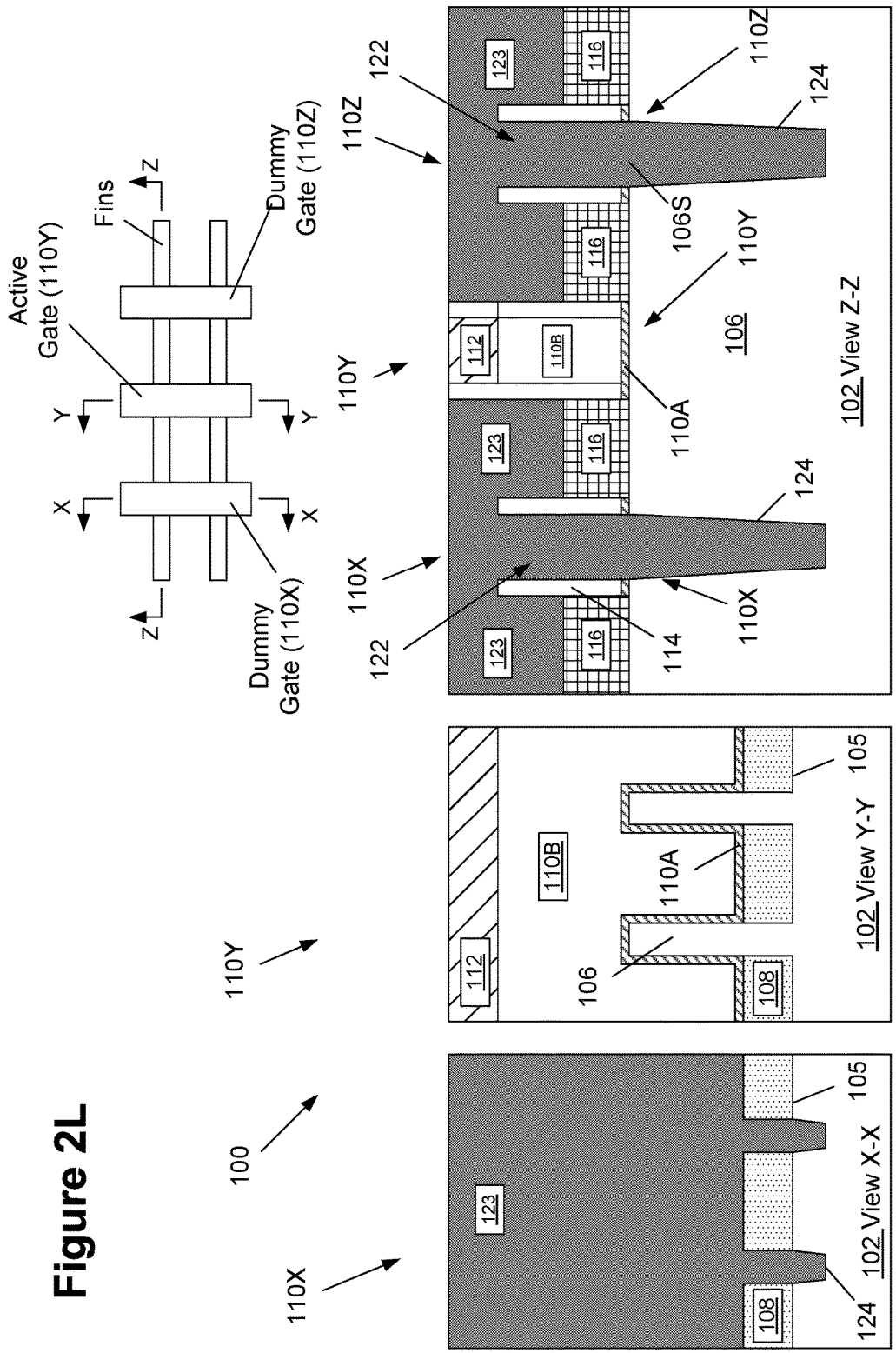
Figure 2M:
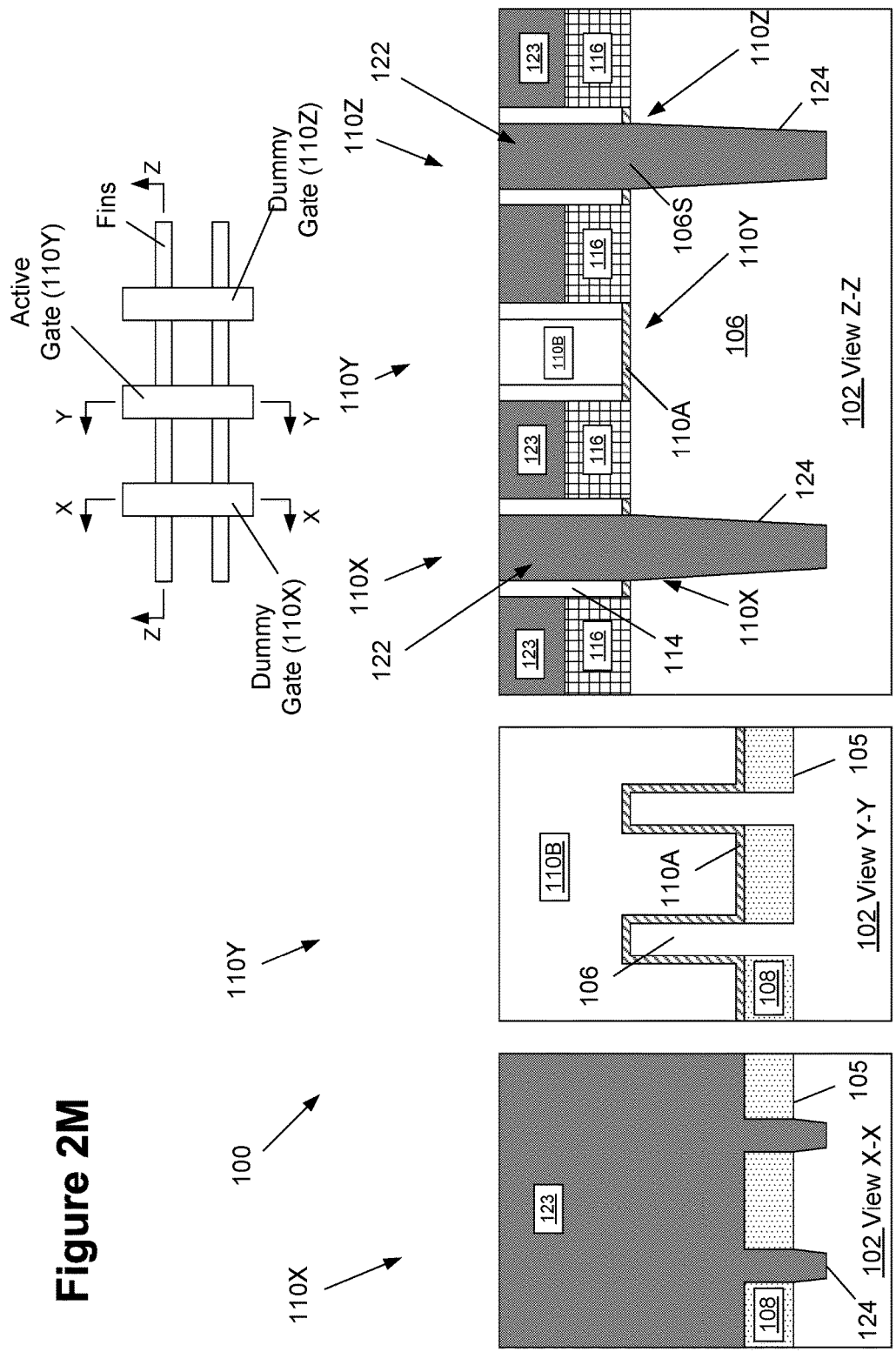
Figure 2N:
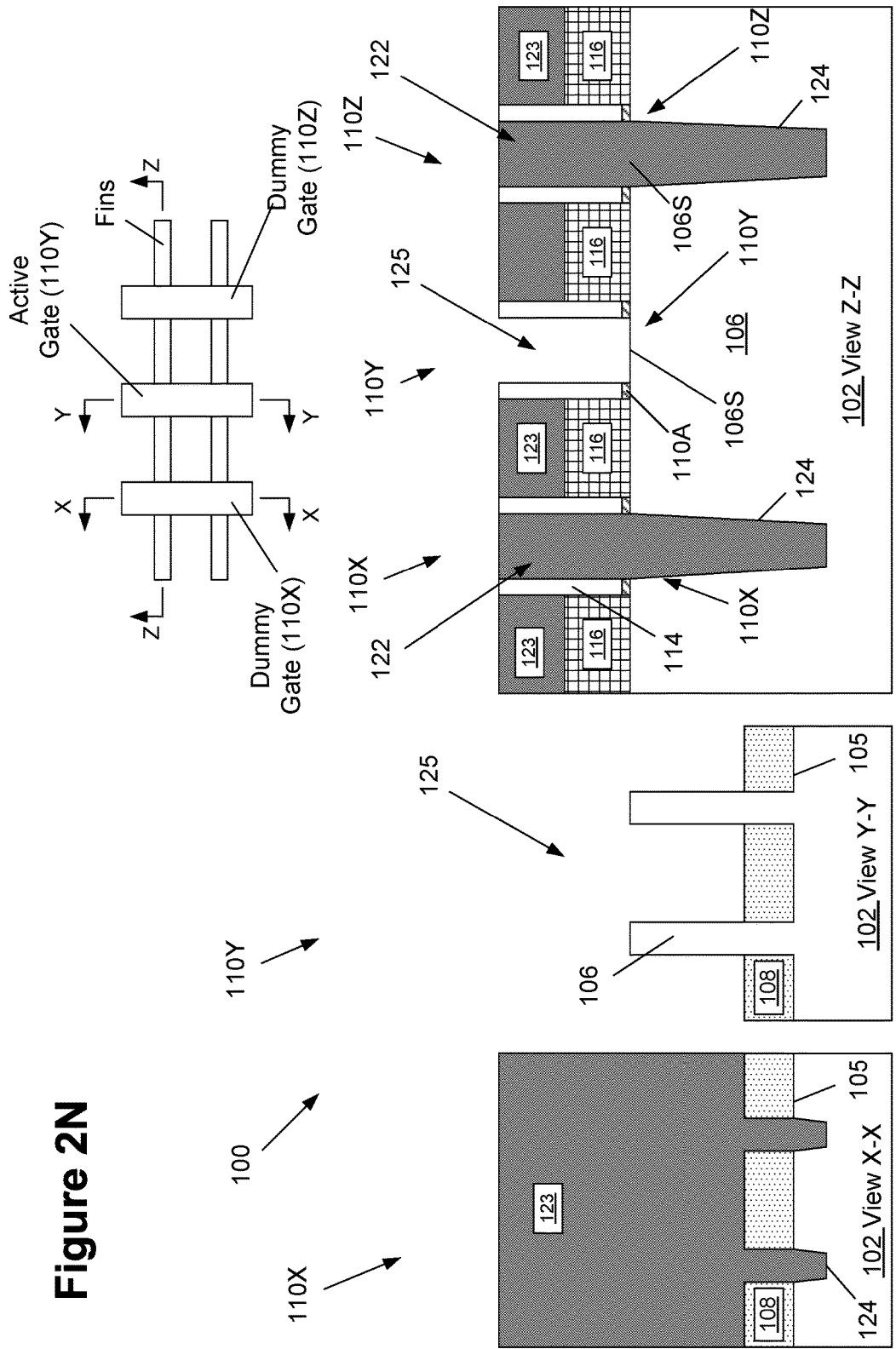
Figure 2O:
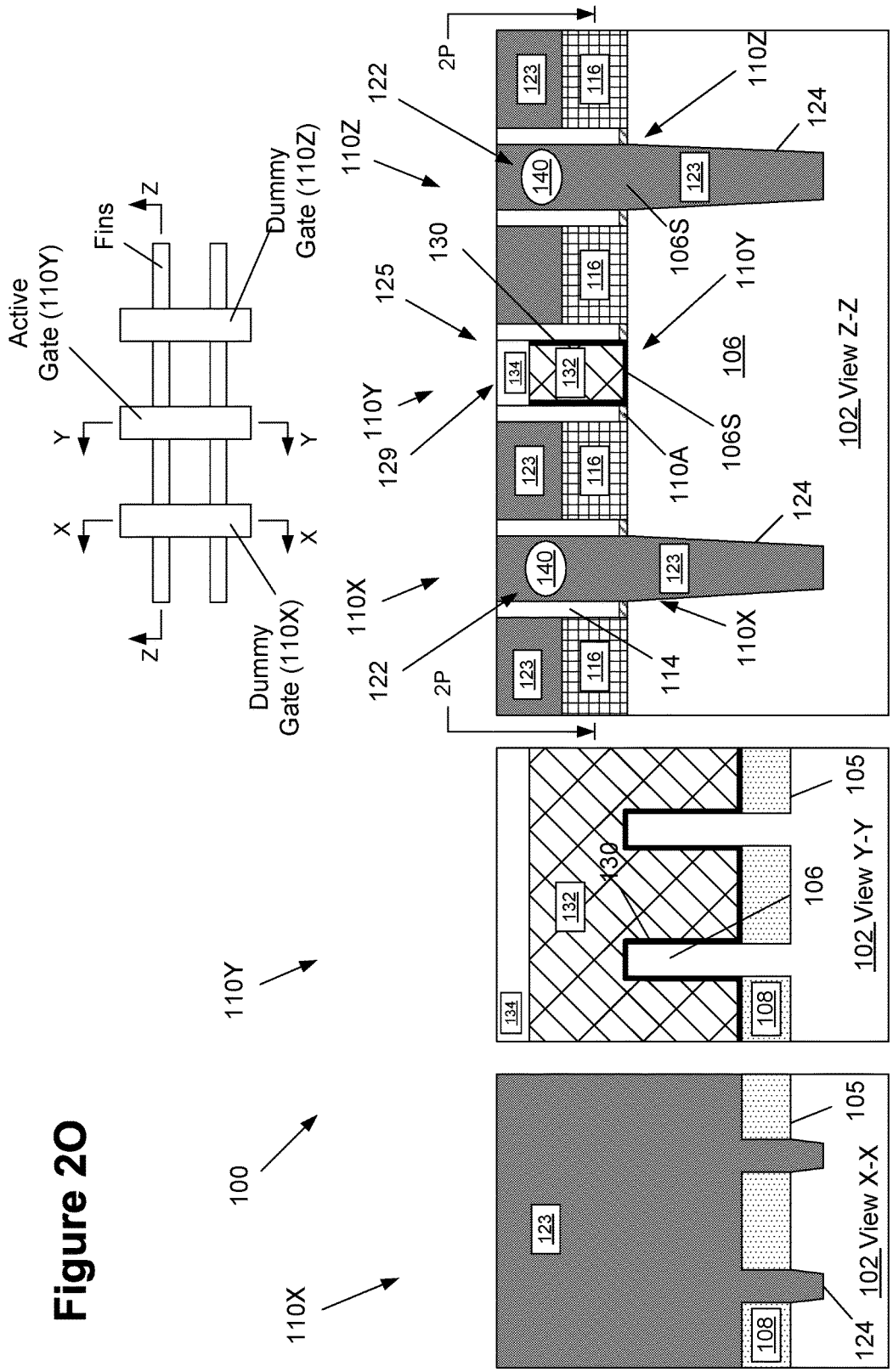
Figure 2P:
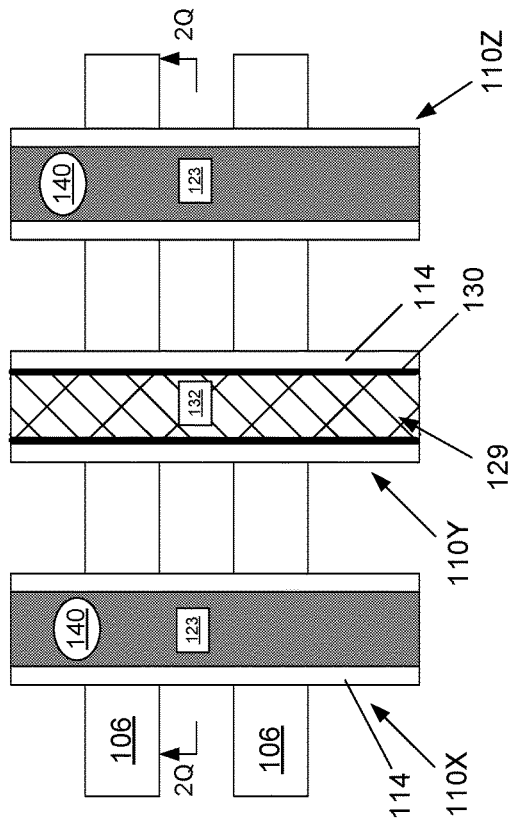
Figure 2Q:
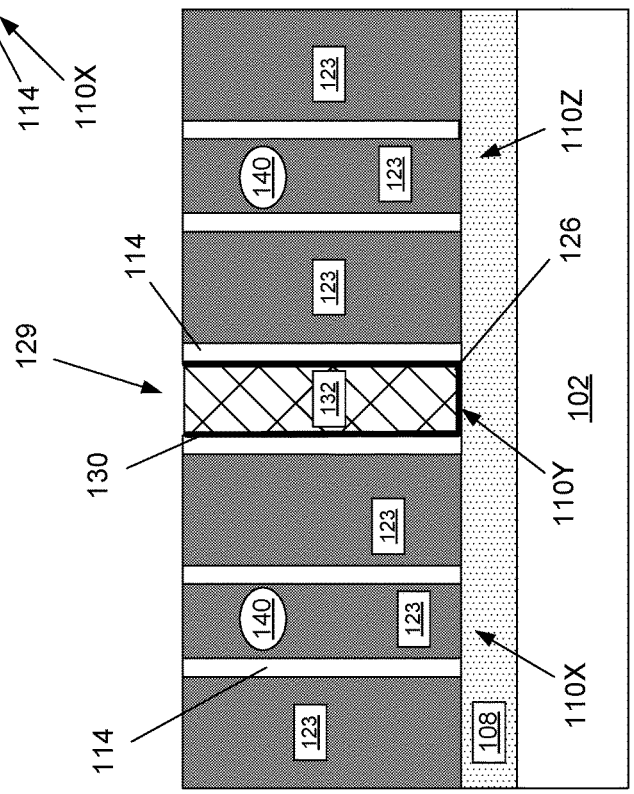
Figure 2R:
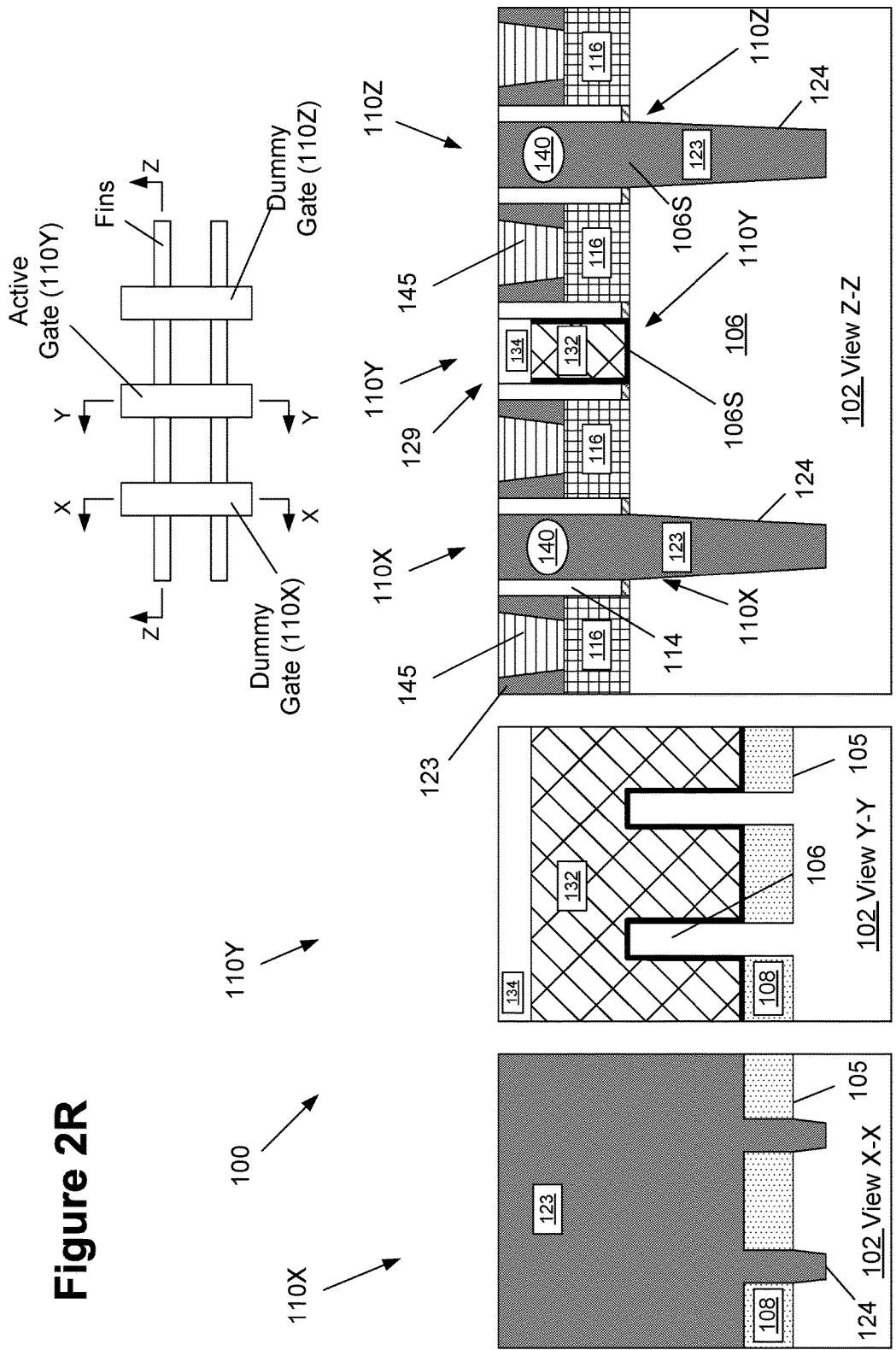

FIGS. 2A-2R present various views of one illustrative embodiment of a method of forming a diffusion break on an integrated circuit product 100 comprised of FinFET devices. The drawings also include a simplistic plan view of the product 100 (in the upper right corner) that depicts the location where various cross-sectional views depicted in the following drawings will be taken. More specifically, the view "X-X" is a cross-sectional view taken through a dummy gate structure (in the gate-width direction) that will eventually be formed above the illustrative fins. The view Y-Y is a cross-sectional view taken through an active gate structure (in the gate-width direction) that will eventually be formed above the illustrative fins. The view "Z-Z" is a cross-sectional view that is taken through the long axis of a fin transverse to the long axis of the gate structures of the two dummy gate structures and the active gate structure (i.e., in a direction that corresponds to the current transport direction of the active FinFET device). Other views are taken where indicated in the attached drawings.

In the examples depicted herein, the integrated circuit product 100 will be formed in and above a semiconductor substrate 102. The substrate 102 may have a variety of configurations, such as a semiconductor-on-insulator (SOI) configuration that includes a bulk semiconductor layer, a buried insulation layer and an active semiconductor layer. Alternatively, the substrate may have a simple bulk configuration. The substrate 102 may be made of silicon or it may be made of materials other than silicon, e.g., silicon-germanium, a III-V compound semiconductor material, etc. Thus, the terms "substrate" or "semiconductor substrate" should be understood to cover all semiconducting materials and all forms of such materials.

FIG. 2A depicts the product 100 at a point in fabrication wherein several process operations have been performed. First, a patterned etch mask 104, e.g., a combination of a silicon dioxide layer (e.g., a pad oxide—not separately shown) and a silicon nitride layer (e.g., a pad nitride—not separately shown) was formed above the substrate 102. In some cases, the pad oxide layer may be omitted if desired. Thereafter, one or more etching processes were performed through the patterned etch mask 104 so as to define a plurality of fin-formation trenches 105 in the substrate 102. This results in the formation of a plurality of fins 106. The illustrative active FinFET device 100 disclosed herein will be depicted as being comprised of two illustrative fins 106. However, as will be recognized by those skilled in the art after a complete reading of the present application, the methods and devices disclosed herein may be employed when manufacturing FinFET devices having any number of fins. As depicted in the plan view, the fins 106 extend laterally into and out of the drawing page in the current transport direction of the product 100 and into what will become the source/drain regions 101 of the active FinFET device.

With continuing reference to FIG. 2A, the overall size, shape and configuration of the trenches 105 and the fins 106 may vary depending on the particular application. The depth and width of the trenches 105 may vary depending upon the particular application. In one illustrative embodiment, based on current day technology, the overall depth (relative to the upper surface of the substrate 102) of the trenches 105 may range from approximately 20-50 nm. In the illustrative examples depicted in the attached figures, the trenches 105 and the fins 106 will be simplistically depicted as having generally rectangular portions and sections. In an actual real-world device, the sidewalls of the trenches 105 may be somewhat inwardly tapered, although that configuration is not depicted in the drawings. Thus, the size and configuration of the trenches 105 and the fins 106, and the manner in which they are made, should not be considered a limitation of the present invention. For ease of disclosure, only the substantially rectangular-shaped trenches 105 and fins 106 having a substantially rectangular-shaped cross-sectional configuration will be depicted in the drawings.

FIG. 2B depicts the product 100 after several process operations were performed to form a recessed layer of insulating material 108, e.g., silicon dioxide, in the trenches 105 between the fins 106. The recessed layer of insulating material 108 may be formed by over-filling the trenches 105 with an insulating material, performing a chemical mechanical planarization (CMP) process on the layer of insulating material that stops on the upper surface 106S of the fins 106 (and thereby removes the patterned hard mask layer 104), and performing a recess etching process on the layer of insulating material 108 so as to recess the upper surface 108S of the layer of insulating material 108 to a desired height level within the trenches 105.

The inventions disclosed herein will be disclosed in the context of forming a gate structure for the active FinFET device by performing a replacement gate process. Accordingly, FIG. 2C depicts the product 100 after various layers of material for multiple sacrificial gate structures 110, i.e., a sacrificial gate insulation layer 110A and a layer of sacrificial gate electrode material 110B, and the material for a gate cap layer 112 were sequentially deposited above the substrate 102. In general, the sacrificial gate insulation layer 110A is comprised of a material such as silicon dioxide, and the sacrificial gate electrode material 110B is comprised of a material such as polysilicon or amorphous silicon, while the gate cap layer 112 is comprised of a material such as silicon nitride. The thickness of these materials may vary depending upon the particular application.

FIG. 2D depicts the product 100 after one or more etching processes were performed through a patterned etch mask (not shown), such as a patterned layer of photoresist material, to define a plurality of sacrificial gate structures 110X, 110Y and 110Z, as well as associated gate cap layers 112, above the substrate 102. The sacrificial gate structures 110X and 110Z are for dummy gates, while the sacrificial gate structure 110Y is for an active gate for the active FinFET device. As depicted, the active gate 110Y is laterally positioned between the two dummy gates 110X, 110Z.

FIG. 2E depicts the product 100 after several process operations were performed. First, simplistically depicted sidewall spacers 114 were formed adjacent the sacrificial gate structures 110X-Z. Thereafter, epi semiconductor material 116 was grown on the portions of the fins 106 positioned in the source/drain regions 101 of the active FinFET device, i.e., on the portions of the fins 106 positioned laterally outside of the spacers 114 on the sacrificial gate structure 110Y for the active gate. In some applications, the fins 106 in the source/drain regions 101 of the active FinFET device may be recessed prior to the formation of the epi semiconductor material 116.

FIG. 2F depicts the product 100 after a sacrificial layer of material 118 was formed above the substrate 102. The sacrificial layer of material 118 may be comprised of a variety of different materials and may be formed to any desired thickness. In one illustrative embodiment, the sacrificial layer of material 118 may be comprised of material such as SOH, or an OPL layer (Optical Planarization Layer) that may be formed by performing a spin-coating process. Alternatively, the sacrificial layer of material 118 may be a layer of material that is formed by performing a traditional deposition process, e.g., silicon dioxide, silicon oxynitride, etc. In one illustrative embodiment, the sacrificial layer of material 118 is formed on and in contact with the epi material 116 so as to overfill the lateral spaces between the gate structures 110X-Z. In one illustrative embodiment, the sacrificial layer of material 118 may be formed to a thickness such that an upper surface 118S of the sacrificial layer of material 118 is positioned above an upper surface 112S of the gate cap layers 112. A planarization process (e.g., CMP) may be performed on the sacrificial layer of material 118 after it is formed or such a planarization step may be omitted.

FIG. 2G depicts the product 100 after a patterned masking layer 120, e.g., a patterned layer of photoresist, was formed above the product depicted in FIG. 2F. Openings 120A in the patterned masking layer 120 expose the area above the gate cap layers 112 and the sidewall spacers 114 for each of the dummy gate structures 110X, 110Z, while masking the area above the gate structure 110Y for the active FinFET device.

FIG. 2H depicts the product 100 after several process operations were performed. First, a timed recess etching process was performed through the openings 120A in the patterned masking layer 120 to remove exposed portions of the sacrificial layer of material 118. This process operation exposes at least the gate cap layers 112 and perhaps the spacer 114 for the dummy gate structures 110X, 110Z. Thereafter, the exposed gate cap layers 112 and portions of the exposed spacers 114 adjacent the sacrificial gate structure 110X, 110Z for the dummy gates were selectively removed relative to the surrounding structures. These process operations expose the sacrificial gate material 110B of the dummy gate structures 110X, 110Z for removal.

FIG. 2I depicts the product 100 after several process operations were performed. First, in one embodiment, the patterned masking layer 120 was removed, but the patterned masking layer 120 may be left in position if desired at this point in the process flow. Then, one or more etching processes were performed to remove the sacrificial gate material 110B and the sacrificial gate insulation layer 110A of the sacrificial gate structures 110X, 110Z for the dummy gates relative to the surrounding materials. These process operations result in the formation of isolation cavities 122 that expose the surface 106S of the fins 106 within the isolation cavities 122. During these process operations, some of the thickness of the sacrificial layer of material 118 may also be consumed, but such a situation is not depicted in the drawings. Note that, at this point in the process flow, the sacrificial layer of material 118 (and the underlying gate cap layer 112) still protects the sacrificial gate structure 110Y for the gate of the active FinFET device.

FIG. 2J depicts the product 100 after a timed, anisotropic etching process was performed through the isolation cavities 122 to remove a portion of the fins 106 and thereby define isolation trenches 124 in the fins 106, and perhaps in the substrate 102. The overall depth of the trenches 124 may vary depending upon the particular application. In the depicted example, the trenches 124 have a depth that is greater than the depth of the initial fin-formation trenches 105, although such a configuration may not exist in all applications. As depicted in the view X-X, this effectively removes or cuts the fin 106 in the areas of the fins 106 exposed by the isolation cavities 122 of the dummy gate structures 110X, 110Z. However, in some cases, the trenches 124 may have a depth that only removes a portion of the vertical height of the fins 106.

FIG. 2K depicts the product 100 after the sacrificial layer of material 118 was removed, thereby exposing the epi semiconductor material 116.

FIG. 2L depicts the product 100 after several process operations were performed. First, a layer of insulating material 123, such as silicon dioxide, was formed across the substrate 102 so as to overfill the trenches 124 and the cavities 122. Thereafter, a CMP process operation was performed to planarize the upper surface of the layer of insulating material 123 using the gate cap layer 112 as a polish-stop. Although not depicted, if desired, a conformal deposition process, e.g., ALD, CVD, may be performed to form a relatively thin liner layer (not shown) across the substrate and in the trenches 124 and cavities 122 prior to the formation of the layer of insulating material 123. If such a liner layer is formed, it may be made of a material that is different than that of the layer of insulating material 123.

In general, the next major process operation involves removing the sacrificial gate structure of the active gate 110Y and replacing it with a final gate structure using replacement gate manufacturing techniques. Accordingly, FIG. 2M depicts the product 100 after one or more planarization processes were performed that ultimately stops on the sacrificial gate material 110B of the sacrificial gate structure 110Y. These process operations reduce the thickness of the layer of insulating material 123, remove the gate cap layer 112 and portions of the spacers 114 and ultimately expose the sacrificial gate material 110B of the active gate 110Y.

FIG. 2N depicts the product 100 after one or more etching processes were performed to remove the sacrificial gate material 110B and the sacrificial gate insulation layer 110A of the active gate 110Y relative to the surrounding materials. In some applications, the sacrificial gate insulation layer 110A may not be removed. However, in the depicted example, these operations result in the exposure of the surface 106S of the fin 106 for the active gate 110Y, and the formation of a replacement gate cavity 125 for the active gate 110Y where a replacement gate structure will be formed.

At the point of processing depicted in FIG. 2N, traditional replacement gate manufacturing techniques may be performed to form a replacement or final gate structure 129 in the replacement gate cavity 125. The replacement gate structure 129 depicted herein is intended to be representative in nature of any type of replacement gate structure that may be employed in manufacturing integrated circuit products. FIG. 2O depicts the product 100 after several process operations were performed. First, a conformal deposition process was performed to form a high-k (k value of 10 or greater) gate insulation layer 130 in the replacement gate cavity 125. Typically, a pre-clean process will be performed in an attempt to remove all foreign materials from within the replacement gate cavity 125 prior to forming the high-k gate insulation layer 130. Typically, the conductive materials 132 for the replacement gate structure 129 are comprised of various layers of conductive material that are sequentially deposited into the gate cavity 125 and above the layer of insulating material 123. Then, one or more CMP processes are performed to remove excess materials above the layer of insulating material 123. Next, a recess etching process was performed to recess the materials in the gate cavity 125 to make room for the gate cap layer 134. Then, the gate cap layer 134 was formed in the gate cavity 125 above the recessed replacement gate materials 132, 130. The gate cap layer 134 may be comprised of a variety of materials, e.g., silicon nitride, and it may be formed by overfilling the remaining portions of the gate cavity 125 with the gate cap material and thereafter performing a CMP process to remove excess materials that stop on the layer of insulating material 123.

As will be appreciated by those skilled in the art after a complete reading of the present application, the insulation material 123 positioned in the trenches 124 constitutes an isolation structure 140, or diffusion break, for the active FinFET device. FIG. 2P is a simplistic plan view of a portion of the product 100 taken where indicated in FIG. 2O with the epi semiconductor material omitted. FIG. 2Q is a cross-sectional view taken where indicated in FIG. 2P. The gate cap layer 134 for the replacement gate structure 129 is not shown in either FIG. 2P or 2Q given the location where the cross-sectional view 2P is taken, i.e., at a level that is below the level of the gate cap layer 134. As can be seen, the isolation structures 140 laterally isolate the active FinFET device 110Y. Importantly, since the fins 106 were not cut until after the epi semiconductor material 116 was formed on the fins 106, the epi semiconductor material 116 is consistent across all devices and at least some of the problems identified in the background section of this application may be avoided.

FIG. 2R depicts the product after simplistically depicted conductive contacts 145 are formed in the insulation material 123 so as to provide electrical contact to the epi semiconductor material 116, e.g., to provide electrical contact to the source/drain regions of the active FinFET device. The conductive contacts 145 may be comprised of a variety of different materials, e.g., tungsten, they may have any desired configuration, and they may be formed using any technique. In some cases, additional insulation material (not shown) may be formed above the layer of insulating material 123, and the conductive contacts 145 to the source/drain regions may be formed at or about the same time as is a conductive contact (not shown) for the replacement gate structure 129. Importantly, the conductive contacts 145 are at least partially positioned in the same layer of insulating material 123 that was formed so as to form the isolation structure 140 in the trenches 124.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. As used herein, spatial references "top," "bottom," "upper," "lower," "vertical," "horizontal" and the like may be used for convenience when referring to structures of FET devices. These references are intended to be used in a manner consistent with the drawings only for teaching purposes, and are not intended as absolute references for FET structures. For example, FETs may be oriented spatially in any manner different from the orientations shown in the drawings. Accordingly, the protection sought herein is as set forth in the claims below.

What is claimed:

1. A method of forming a diffusion break for a FinFET device comprising a fin formed in a semiconductor substrate, the method comprising:

forming a first gate structure above said fin, said first gate structure comprising sacrificial gate materials, a sidewall spacer and a gate cap layer;

forming epi semiconductor material on exposed portions of said fin;

forming a patterned sacrificial layer of material above said epi semiconductor material, wherein said patterned sacrificial layer of material covers a second gate structure while exposing at least said gate cap layer of said first gate structure;

performing at least one first etching process through said patterned sacrificial layer of material to remove at least said gate cap layer and said sacrificial gate materials of said first gate structure so as to define a first isolation cavity that exposes said fin while leaving said second gate structure intact;

performing at least one second etching process through said first isolation cavity to remove at least a portion of a vertical height of said fin and thereby form a first isolation trench;

removing said patterned sacrificial layer of material; and forming a layer of insulating material above said epi semiconductor material and in said first isolation trench and in said first isolation cavity.

2. The method of claim 1, wherein said second gate structure comprises sacrificial gate materials, a sidewall spacer and a gate cap layer and wherein the method further comprises:

removing at least said gate cap layer and at least a portion of said sacrificial gate materials of said second gate structure so as to define a replacement gate cavity; and forming a replacement gate structure in said replacement gate cavity.

3. The method of claim 1, wherein said layer of insulating material substantially fills said first isolation trench and said first isolation cavity.

4. The method of claim 3, wherein forming said layer of insulating material comprises:

forming said layer of insulating material above said substrate so as to over-fill said first isolation trench and said first isolation cavity; and performing at least one planarization process so as to planarize an upper surface of said layer of insulating material with an upper surface of said gate cap layer of said second gate structure, thereby leaving a first portion of said layer of insulating material positioned in said first isolation trench and in said first isolation cavity.

5. The method of claim 3, wherein said first isolation cavity is partially defined by said sidewall spacer of said first gate structure.

6. The method of claim 1, wherein said first isolation trench is formed so as to remove the entire vertical height of said fin and to extend into said substrate.

7. A method of forming a diffusion break for a FinFET device comprising a fin formed in a semiconductor substrate, the method comprising:

forming first, second and third gate structures above said fin, said second gate structure being laterally positioned between said first and third gate structures, each of said first, second and third gate structures comprising sacrificial gate materials, a sidewall spacer and a gate cap layer;

forming epi semiconductor material on exposed portions of said fin;

forming a patterned sacrificial layer of material above said epi semiconductor material, wherein said patterned sacrificial layer of material covers said second gate structure while exposing at least said gate cap layer of said first and third gate structures;

performing at least one first etching process through said patterned sacrificial layer of material to remove at least said gate cap layer and said sacrificial gate materials of said first and third gate structures so as to define first and second isolation cavities that expose said fin while leaving said second gate structure intact;

performing at least one second etching process through said first and second isolation cavities to remove at least a portion of a vertical height of said fin and thereby form first and second isolation trenches;

removing said patterned sacrificial layer of material; and forming a layer of insulating material above said epi semiconductor material in said first and second isolation trenches and in said first and second isolation cavities.

8. The method of claim 7, further comprising:

removing at least said gate cap layer and at least a portion of said sacrificial gate materials of said second gate structure so as to define a replacement gate cavity; and forming a replacement gate structure in said replacement gate cavity.

9. The method of claim 7, wherein said layer of insulating material substantially fills said first and second isolation trenches and said first and second isolation cavities.

10. The method of claim 7, wherein forming said layer of insulating material comprises:

forming said layer of insulating material above said substrate so as to over-fill said first and second isolation trenches and said first and second isolation cavities; and performing at least one planarization process so as to planarize an upper surface of said layer of insulating material with an upper surface of said gate cap layer of said second gate structure, thereby leaving a first portion of said layer of insulating material positioned in said first isolation trench and in said first isolation cavity and a second portion of said layer of insulating material positioned in said second isolation cavity and in said second isolation trench.

11. The method of claim 7, wherein said first and second isolation cavities are partially defined by said sidewall spacer of said first and third gate structures, respectively.

12. The method of claim 7, wherein said first and second isolation trenches are formed so as to remove the entire vertical height of said fin and to extend into said substrate.

13. The method of claim 7, wherein forming said patterned sacrificial layer of material comprises:

forming a sacrificial layer of material on and in contact with said epi semiconductor material;

forming a patterned etch mask above said sacrificial layer of material; and performing an etching process through said patterned etch mask to remove exposed portions of said sacrificial layer of material.

14. The method of claim 13, wherein performing said at least one first etching process comprises:

performing at least one third etching process so as to remove said gate cap layer and a portion of a vertical height of said sidewall spacer for each of said first and third gate structures, wherein at the completion of said at least one first etching process, an upper surface of said sacrificial gate materials of said first and third gate structures is exposed; and performing at least one fourth etching process so as to remove substantially all of said sacrificial gate materials of said first and third gate structures so as to thereby define said first and second isolation cavities.

15. The method of claim 7, wherein said sacrificial layer of material comprises one of SOH, OPL or silicon dioxide and said layer of insulating material comprises silicon dioxide.

16. The method of claim 7, wherein said sacrificial gate materials of said first, second and third gate structures are comprised of one of polysilicon or amorphous silicon and a layer of silicon dioxide.

17. The method of claim 7, wherein said replacement gate structure comprises a high-k gate insulation layer and at least one layer of metal.

18. The method of claim 13, wherein said at least one second etching process is performed prior to removing said patterned etch mask.

19. The method of claim 13, wherein said at least one second etching process is performed after removing said patterned etch mask.

20. The method of claim 7, wherein, prior to forming said epi semiconductor material on said exposed portions of said fin, the method comprises etching a trench into said fin and forming said epi semiconductor material in said trench in said fin.

21. A method of forming a diffusion break for a FinFET device comprising a fin formed in a semiconductor substrate, the method comprising:

forming first, second and third gate structures above said fin, said second gate structure being laterally positioned between said first and third gate structures, each of said first, second and third gate structures comprising sacrificial gate materials, a sidewall spacer and a gate cap layer;

forming epi semiconductor material on exposed portions of said fin;

forming a sacrificial layer of material on and in contact with said epi semiconductor material, said sacrificial layer of material having an upper surface that is positioned at a level that is above a level of an upper surface of said gate cap layer of said first, second and third gate structures;

forming a patterned etch mask above said sacrificial layer of material;

performing an etching process through said patterned etch mask to remove exposed portions of said sacrificial layer of material so as to thereby define a patterned sacrificial layer of material, wherein said patterned sacrificial layer of material covers said second gate structure while exposing at least said gate cap layer of said first and third gate structures;

performing at least one first etching process so as to remove said gate cap layer and a portion of a vertical height of said spacer for each of said first and third gate structures, wherein, at the completion of said at least one first etching process, an upper surface of said sacrificial gate materials of said first and third gate structures is exposed;

performing at least one second etching process so as to remove substantially all of said sacrificial gate materials of said first and third gate structures so as to define first and second isolation cavities that expose said fin while leaving said second gate structure intact;

performing at least one third etching process through said first and second isolation cavities to remove at least a portion of a vertical height of said fin and thereby form first and second isolation trenches;

removing said patterned sacrificial layer of material; and forming a layer of insulating material above said epi semiconductor material, said layer of insulating material substantially filling said first and second isolation trenches and said first and second isolation cavities.

22. The method of claim 21, further comprising:

removing at least said gate cap layer and at least a portion of said sacrificial gate materials of said second gate structure so as to define a replacement gate cavity; and forming a replacement gate structure in said replacement gate cavity.

23. The method of claim 21, wherein forming said layer of insulating material comprises:

forming said layer of insulating material above said substrate so as to over-fill said first and second isolation trenches and said first and second isolation cavities; and performing at least one planarization process so as to planarize an upper surface of said layer of insulating material with an upper surface of said gate cap layer of said second gate structure, thereby leaving a first portion of said layer of insulating material positioned in said first isolation trench and in said first isolation cavity and a second portion of said layer of insulating material positioned in said second isolation cavity and in said second isolation trench.

24. The method of claim 21, wherein said first and second isolation cavities are partially defined by said sidewall spacer of said first and third gate structures, respectively.

25. The method of claim 24, wherein said first and second isolation trenches are formed so as to remove the entire vertical height of said fin and to extend into said substrate.

* * * * *